United States Patent
Kubota (10) Patent No.: US 9,160,154 B2
(45) Date of Patent: Oct. 13, 2015

(54) BUS BAR AND ELECTRICAL JUNCTION BOX HAVING THE SAME

(71) Applicant: Yazaki Corporation, Tokyo (JP)

(72) Inventor: Mitsuji Kubota, Kosai (JP)

(73) Assignee: Yazaki Corporation, Tokyo (JP)

( * ) Notice: Subject to any disclaimer, the term of this patent is extended or adjusted under 35 U.S.C. 154(b) by 10 days.

(21) Appl. No.: 13/922,583

(22) Filed: Jun. 20, 2013

(65) Prior Publication Data

US 2014/0000960 A1 Jan. 2, 2014

(30) Foreign Application Priority Data

Jun. 27, 2012 (JP) .................................. 2012-143650

(51) Int. Cl.
 *H02G 5/00* (2006.01)
 *H02G 3/08* (2006.01)
 *H05K 7/02* (2006.01)

(52) U.S. Cl.
 CPC . *H02G 5/00* (2013.01); *H02G 3/08* (2013.01); *H05K 7/026* (2013.01)

(58) Field of Classification Search
 CPC .................................. H02G 5/00; H02G 3/08
 See application file for complete search history.

(56) References Cited

U.S. PATENT DOCUMENTS

| 5,795,193 | A | * | 8/1998 | Yang | 439/620.27 |
| 6,759,938 | B2 | * | 7/2004 | Matsumura et al. | 337/161 |
| 7,592,892 | B2 | * | 9/2009 | Ito et al. | 337/159 |
| 8,337,251 | B2 | * | 12/2012 | Ecker | 439/620.27 |

FOREIGN PATENT DOCUMENTS

JP 2003037918 A 2/2003
JP 2007-043810 A 2/2007

OTHER PUBLICATIONS

Office Action dated Feb. 28, 2015 issued for corresponding Chinese Patent Application No. 201310259866.X.

* cited by examiner

*Primary Examiner* — Timothy Thompson
*Assistant Examiner* — Krystal Robinson
(74) *Attorney, Agent, or Firm* — Locke Lord LLP (57) ABSTRACT

A bus bar is made by punching a single metal plate and by folding two-dot chain line portions. The bus bar includes: a power input portion into which the power is inputted; a tuning-fork-shaped terminal into which a relay terminal is inserted; a plurality of substrate connecting portions soldered to a printed circuit board; and a routing portion. The routing portion includes: a trunk portion extended in a band shape from the power input portion; a plurality of branch portions branching off from the trunk portion to the tuning-fork-shaped terminal and the substrate connecting portions. A width of the trunk portion is formed gradually narrower as extending away from the power input portion. Namely, widths of the trunk portion further away from the power input portion than the branch portion are formed narrower than a width from the power input portion to the branch portion.

4 Claims, 7 Drawing Sheets

BUS BAR AND ELECTRICAL JUNCTION BOX HAVING THE SAME

CROSS REFERENCE TO RELATED APPLICATIONS

This application is on the basis of Japanese Patent Application No. 2012-143650, the contents of which are hereby incorporated by reference.

TECHNICAL FIELD

The present invention relates to a bus bar made by punching a metal plate, and to an electrical junction box having the bus bar.

BACKGROUND ART

Figure 7:
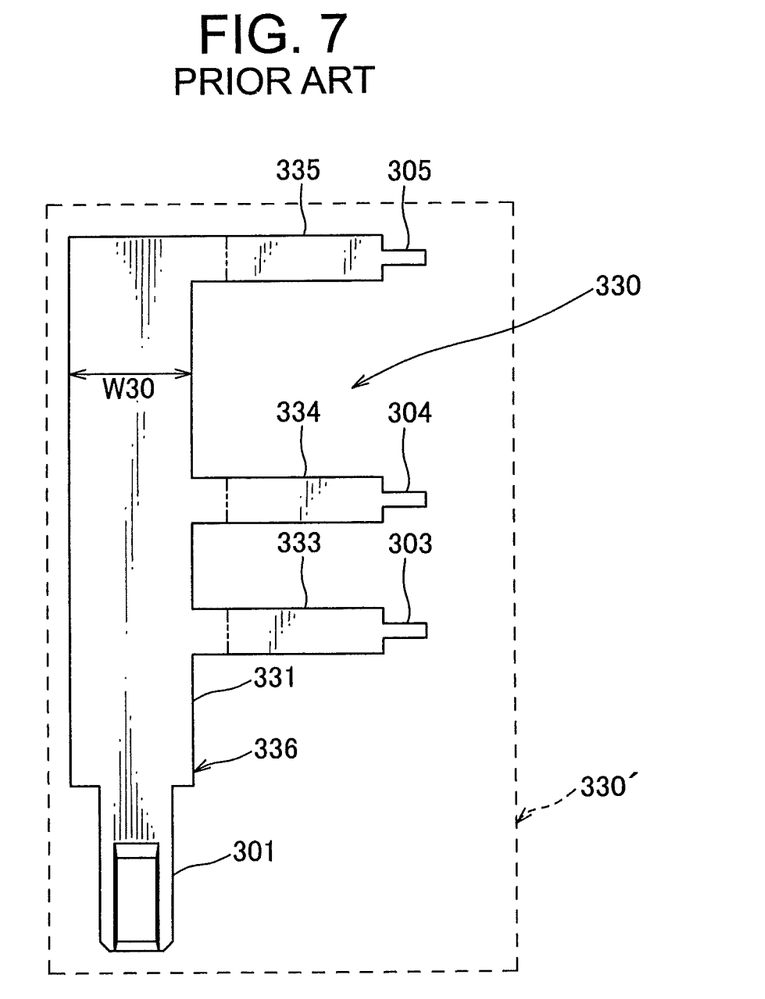
FIG. 7 is a development view showing a conventional bus bar.

FIG. 7 is a development view showing a conventional bus bar. A bus bar 330 shown in FIG. 7 is used as a power distribution member in an on-vehicle electrical junction box. This electrical junction box includes: the bus bar 330; a printed circuit board; electronic components such as fuse and fusible link; and a housing receiving them (see PTL 1).

The bus bar 330 is made by punching a single metal plate 330' and folding two-dot chain line portions. This bus bar 330 includes: a power input portion 301 to which a connector and a fusible link are connected, and the power is inputted; a plurality of substrate connecting portions 303, 304, 305 soldered to the printed circuit board; and a routing portion 336 routed from the power input portion 301 to the plurality of substrate connecting portions 303, 304, 305. Further, the routing portion 336 includes: a trunk portion 331 extended straight from the power input portion 301; and a plurality of branch portions 333, 334, 335 branching off from the trunk portion 331 to the substrate connecting portions 303, 304, 305. Such a bus bar 330 distributes the power inputted from the power input portion 301 to the printed circuit board via the substrate connecting portions 303, 304, 305.

CITATION LIST

Patent Literature

PTL 1: JP, A, 2007-43810

SUMMARY OF INVENTION

Technical Problem

However, in the above bus bar 330, a width W30 of the trunk portion 331 is constant from one end to the other end. Namely, when an allowable current of the power input portion 301 is 60 ampere, the width of the trunk portion 331 must be a width (sectional area) allowing 60 ampere from the power input portion 301 to the branch portion 333. However, in a portion further away from the power input portion 301 than the branch portion 333, the width may be a width allowing 60 ampere minus a current distributed to the branch portion 333. Nevertheless, in the conventional bus bar 330, the trunk portion 331 is formed with a constant width. Therefore, a large amount of metal is used in the bus bar, and a cost of the bus bar and a weight of the bus bar are increased.

Accordingly, an object of the present invention is to provide a bus bar able to be small-sized and light-weighted, and to provide an electrical junction box having the bus bar.

Solution to Problem

For achieving the object, according to a first aspect of the present invention, there is provided a bus bar made by punching a metal plate, including: a power input portion; a plurality of output portions; and a routing portion routed from the power input portion to the plurality of output portions, wherein the routing portion includes: a trunk portion and a plurality of branch portions branching off from the trunk portion to the output portions, and wherein a width of the trunk portion is gradually narrower as extending away from the power input portion.

According to a second aspect of the present invention, there is provided the bus bar as described in the first aspect, wherein the branch portions are folded with respect to the trunk portion, and in a development condition, at least one of the branch portions is extended parallel to the trunk portion.

According to a third aspect of the present invention, there is provided an electrical junction box having the bus bar as described in the first or second aspect.

Advantageous Effects of Invention

According to the invention described in the first aspect, because the width of the trunk portion is gradually narrower as extending away from the power input portion, the bus bar able to be small-sized and light-weighted can be provided.

According to the invention described in the second aspect, because the branch portions are folded with respect to the trunk portion, and in a development condition, at least one of the branch portions is extended parallel to the trunk portion, a blanking with smaller material loss is possible, and a material yield is improved.

According to the invention described in the third aspect, because the electrical junction box has the bus bar as described in the first or second aspect, the electrical junction box able to be small-sized and light-weighted can be provided.

These and other objects, features, and advantages of the present invention will become more apparent upon reading of the following detailed description along with the accompanied drawings.

DESCRIPTION OF EMBODIMENTS

First Embodiment

Figure 1:
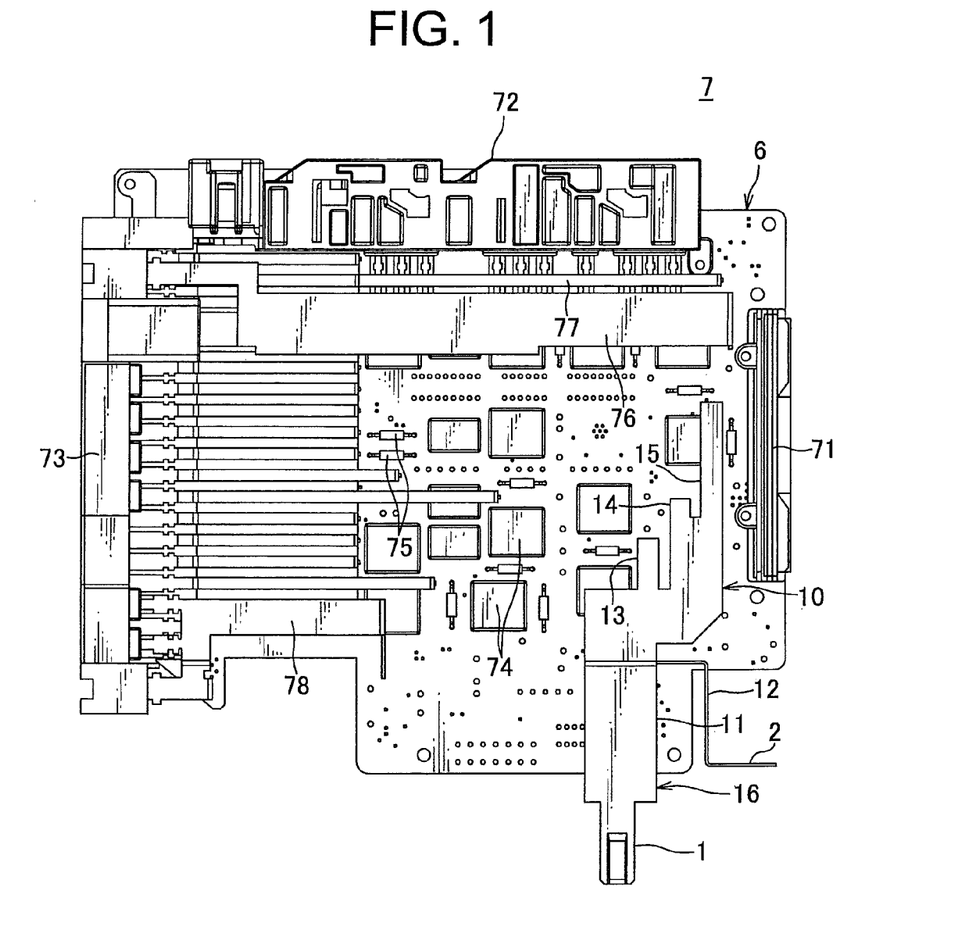
FIG. 1 is a plan view showing a bus bar according to a first embodiment of the present invention connected to a printed circuit board.
Figure 2:
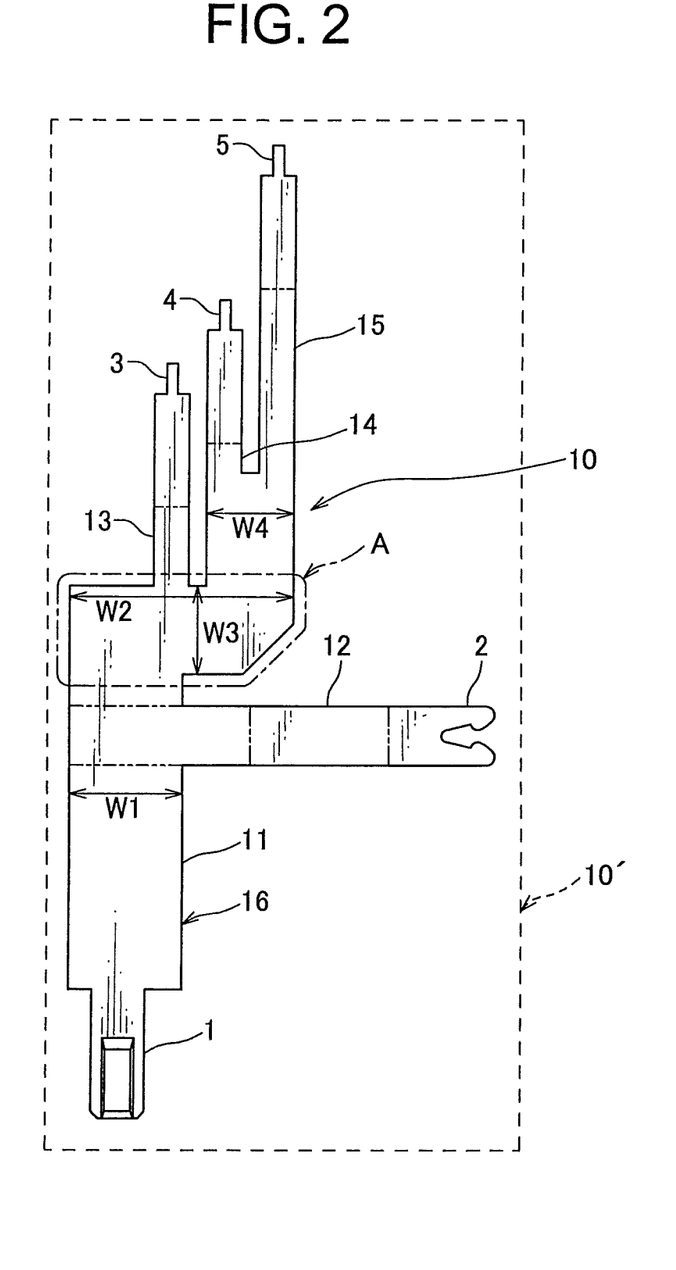
FIG. 2 is a development view showing the bus bar shown in FIG. 1.

A bus bar and an electrical junction box according to a first embodiment of the present invention will be explained with reference to FIGS. 1 and 2. FIG. 1 is a plan view showing a bus bar according to a first embodiment of the present invention connected to a printed circuit board. FIG. 2 is a development view showing the bus bar shown in FIG. 1.

As shown in FIG. 1, a bus bar 10 according to the first embodiment of the present invention is used in an on-vehicle electrical junction box 7. This electrical junction box 7 includes: a plurality of bus bars 10, 76, 77, 78 including the above bus bar 10; a printed circuit board 6; connectors 71, 72, and a fuse block 73 fixed to the printed circuit board 6; a relay 74 and a resistor 75 soldered to the printed circuit board 6; and a housing (not shown) receiving them.

The bus bar 10 is made by punching a single metal plate 10' shown in FIG. 2, and by folding two-dot chain line portions in FIG. 2. This bus bar 10 includes: a rectangular-plate-shaped power input portion 1 to which a connector and a fusible link are connected and the power is inputted; a tuning-fork-shaped terminal 2 into which a relay terminal is inserted; a plurality of substrate connecting portions 3, 4, 5 soldered to the printed circuit board 6; and a routing portion 16 routed from the power input portion 1 to the tuning-fork-shaped terminal 2 and the plurality of substrate connecting portions 3, 4, 5.

Further, the routing portion 16 includes: a trunk portion 11 extended in a band shape from the power input portion 1; and a plurality of branch portions 12, 13, 14, 15 branching off from the trunk portion 11 to the tuning-fork-shaped terminal 2 and the substrate connecting portions 3, 4, 5. Such a bus bar 10 distributes the power inputted from the power input portion 1 to the relay and the printed circuit board 6 via the tuning-fork-shaped terminal 2 and the substrate connecting portions 3, 4, 5. Further, the tuning-fork-shaped terminal 2 and the substrate connecting portions 3, 4, 5 correspond to output portions in claims.

Further, a width of the trunk portion 11 is formed gradually narrower as extending away from the power input portion 1. Namely, widths W3, W4 of the trunk portion 11 further away from the power input portion 1 than the branch portion 12 are formed narrower than a width W1 from the power input portion 1 to the branch portion 12. This is because in a range from the power input portion 1 to the branch portion 12, a width (sectional area) for allowing the current value inputted from the power input portion 1 is needed, however, in a range further away from the power input portion 1 than the branch portion 12, a width for allowing the current value minus the current distributed to the branch portion 12 is enough.

Further, the trunk portion 11 is bent at right angle in a portion A in FIG. 2, namely, from between the branch portion 12 and the branch portion 13 to between the branch portion 13 and the branch portion 14. Because the width of the trunk portion 11 is a distance between two straight lines, at the bent portion of the trunk portion 11, two widths W2 and W3 exist. In this case, the shorter width W3 is referred to as the width of the trunk portion 11. This is because the allowing current is limited by the shorter width W3 at the bent portion A.

In this way, in the bus bar 10, the width of the trunk portion 11 is formed gradually narrower as extending away from the power input portion 1. Therefore, the bus bar 10 can be small-sized and light-weighted. Further, because unnecessary portions of the trunk portion 11 are eliminated, spaces are generated on the printed circuit board 6, and layout flexibility of the relay 74 and the resistor 75 is improved.

Second Embodiment

Figure 3:
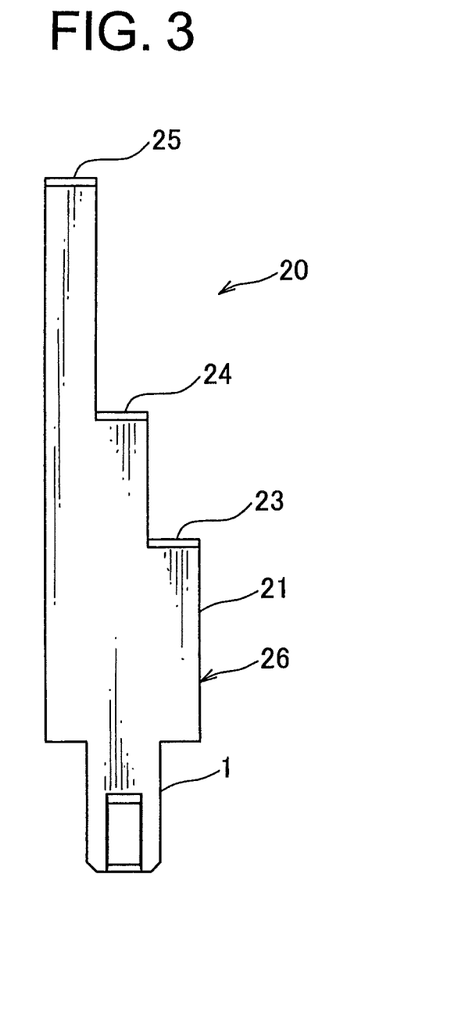
FIG. 3 is a plan view showing a bus bar according to a second embodiment of the present invention.
Figure 4:
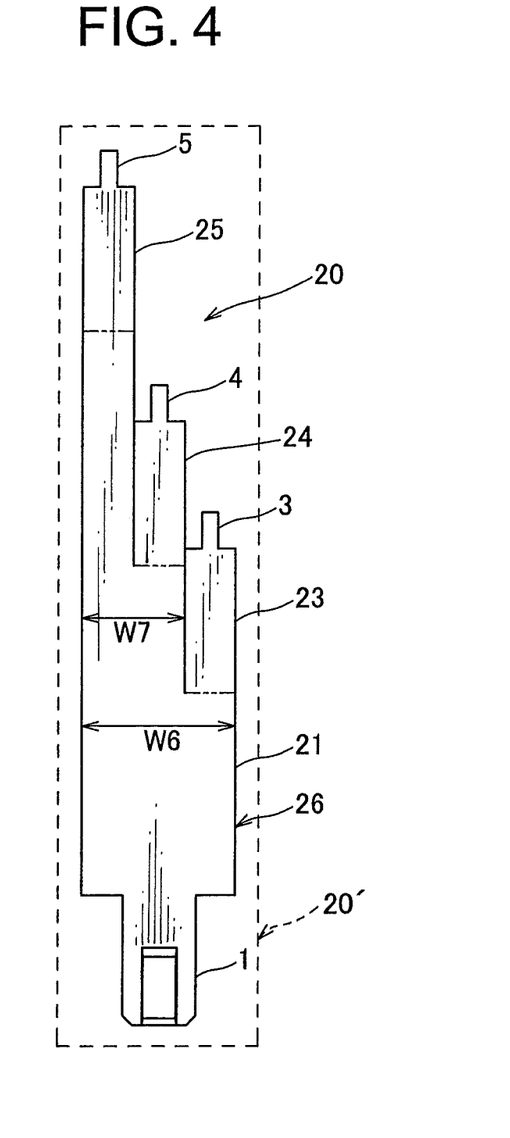
FIG. 4 is a development view showing the bus bar shown in FIG. 3.

A bus bar according to a second embodiment of the present invention will be explained with reference to FIGS. 3 and 4. Further, in FIGS. 3 and 4, the same components as the first embodiment are denoted by the same reference signs, and explanations thereof are omitted. FIG. 3 is a plan view showing the bus bar according to the second embodiment of the present invention. FIG. 4 is a development view showing the bus bar shown in FIG. 3.

A bus bar 20 shown in FIG. 3 is made by punching a single metal plate 20' shown in FIG. 4, and by folding two-dot chain line portions in FIG. 4. This bus bar 20 includes: the power input portion 1; the plurality of substrate connecting portions 3, 4, 5 soldered to the printed circuit board; and a routing portion 26 routed from the power input portion 1 to the plurality of substrate connecting portions 3, 4, 5.

Further, the routing portion 26 includes: a trunk portion 21 extended straight from the power input portion 1; and a plurality of branch portions 23, 24, 25 branching off from the trunk portion 21 to the substrate connecting portions 3, 4, 5. Such a bus bar 20 distributes the power inputted from the power input portion 1 to the printed circuit board via the substrate connecting portions 3, 4, 5.

Further, a width of the trunk portion 21 is formed gradually narrower as extending away from the power input portion 1. Namely, a width W7 of the trunk portion 21 further away from the power input portion 1 than the branch portion 23 is formed narrower than a width W6 from the power input portion 1 to the branch portion 23. This is because in a range from the power input portion 1 to the branch portion 23, a width (sectional area) for allowing the current value inputted from the power input portion 1 is needed, however, in a range further away from the power input portion 1 than the branch portion 23, a width for allowing the current value minus the current distributed to the branch portion 23 is enough. In this way, in the bus bar 20, the width of the trunk portion 21 is formed gradually narrower as extending away from the power input portion 1. Therefore, the bus bar 20 can be small-sized and light-weighted.

Further, as shown in FIG. 3, the branch portions 23, 24, 25 are folded with respect to the trunk portion 21. However, as shown in FIG. 4, in a development condition, the branch portions 23, 24, 25 are extended on an extension line of the trunk portion 21. Further, in the development condition, the branch portion 23 closest to the power input portion 1 is extended parallel to the trunk portion 21 extended to the branch portions 24, 25. When the bus bar 20 has such a shape, a blanking with smaller material loss is possible, and a material yield is improved.

Third Embodiment

Figure 5:
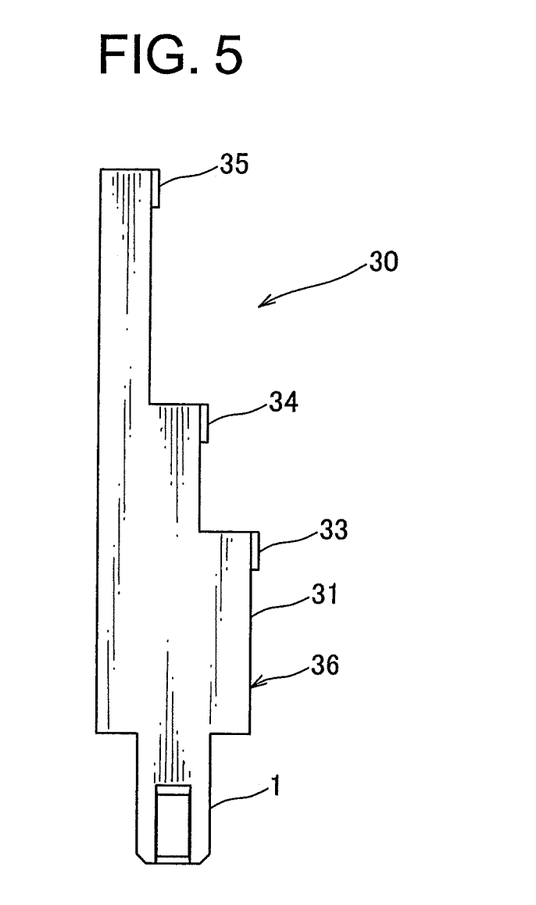
FIG. 5 is a plan view showing a bus bar according to a third embodiment of the present invention.
Figure 6:
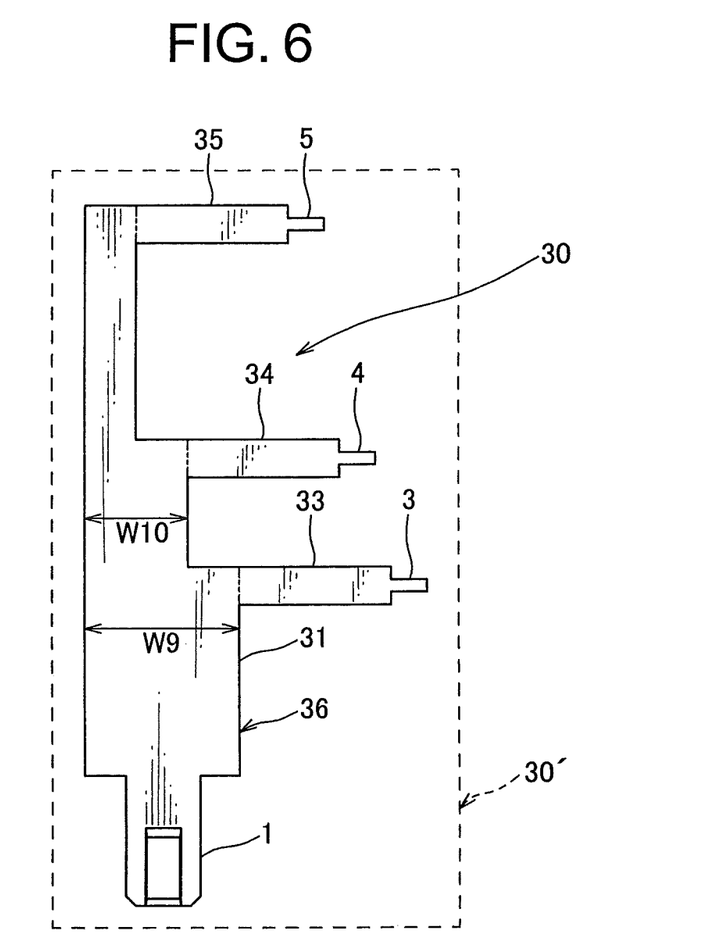
FIG. 6 is a development view showing the bus bar shown in FIG. 5.

A bus bar according to a third embodiment of the present invention will be explained with reference to FIGS. 5 and 6. Further, in FIGS. 5 and 6, the same components as the first and second embodiments are denoted by the same reference signs, and explanations thereof are omitted. FIG. 5 is a plan view showing a bus bar according to the third embodiment of the present invention. FIG. 6 is a development view showing the bus bar shown in FIG. 5.

A bus bar 30 shown in FIG. 5 is made by punching a single metal plate 30' shown in FIG. 6, and by folding two-dot chain line portions in FIG. 6. This bus bar 30 includes: the power input portion 1; the plurality of substrate connecting portions 3, 4, 5 soldered to the printed circuit board; and a routing portion 36 routed from the power input portion 1 to the plurality of substrate connecting portions 3, 4, 5.

Further, the routing portion 36 includes: a trunk portion 31 extended straight from the power input portion 1; and a plurality of branch portions 33, 34, 35 branching off from the trunk portion 31 to the substrate connecting portions 3, 4, 5.

These branch portions 33, 34, 35 are extended in an orthogonal direction to the trunk portion 31. Such a bus bar 30 distributes the power inputted from the power input portion 1 to the printed circuit board via the substrate connecting portions 3, 4, 5.

Further, a width of the trunk portion 31 is formed gradually narrower as extending away from the power input portion 1. Namely, a width W10 of the trunk portion 31 further away from the power input portion 1 than the branch portion 33 is formed narrower than a width W9 from the power input portion 1 to the branch portion 33. This is because in a range from the power input portion 1 to the branch portion 33, a width (sectional area) for allowing the current value inputted from the power input portion 1 is needed, however, in a range further away from the power input portion 1 than the branch portion 33, a width for allowing the current value minus the current distributed to the branch portion 33 is enough. In this way, in the bus bar 30, the width of the trunk portion 31 is formed gradually narrower as extending away from the power input portion 1. Therefore, the bus bar 30 can be small-sized and light-weighted.

Further, the power input portion 1 explained in the first to third embodiments is connected to the connector and the fusible link. However, in addition to this, the power input portion 1 may be soldered to the printed circuit board, and the power may be inputted from the printed circuit board.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

REFERENCE SIGNS LIST 1 power input portion
2 tuning-fork-shaped terminal (output portion)
3, 4, 5 substrate connecting portion (output portion)
7 electrical junction box
10, 20, 30 bus bar
11, 21, 31 trunk portion
12 to 15, 23 to 25, 33 to 35 branch portion
16, 26, 36 routing portion

What is claimed is:

1. A bus bar made by punching a metal plate, comprising:
a power input portion;
a plurality of output portions; and
a routing portion routed from the power input portion to the plurality of output portions,
wherein
the routing portion includes: a trunk portion and a plurality of branch portions branching off from the trunk portion to the output portions,
a width of the trunk portion is a width for allowing current input and current distribution to each branch portion, and
the further the trunk portion extends away from the power input portion, the narrower the width of the trunk portion becomes at a point each branch portion connects to the trunk portion.

2. The bus bar as claimed in claim 1, wherein the branch portions are folded with respect to the trunk portion, and in a development condition, at least one of the branch portions is extended parallel to the trunk portion.

3. An electrical junction box having the bus bar as claimed in claim 1.

4. An electrical junction box having the bus bar as claimed in claim 2.

* * * * *